(12) United States Patent
Wittenbreder, Jr.

(10) Patent No.: US 7,466,168 B1
(45) Date of Patent: Dec. 16, 2008

(54) FLOATING GATE DRIVE CIRCUITS

(76) Inventor: Ernest Henry Wittenbreder, Jr., 3260 S Gillenwater Dr., Flagstaff, AZ (US) 86001-8946

( * ) Notice: Subject to any disclaimer, the term of this patent is extended or adjusted under 35 U.S.C. 154(b) by 101 days.

(21) Appl. No.: 11/670,030

(22) Filed: Feb. 1, 2007

(51) Int. Cl.
*H03K 3/00* (2006.01)

(52) U.S. Cl. .................. 327/108; 327/390; 327/589

(58) Field of Classification Search ............... 327/108, 327/309, 330, 390, 589; 326/88
See application file for complete search history.

(56) References Cited

U.S. PATENT DOCUMENTS 6,127,746 A * 10/2000 Clemente ............... 307/131

* cited by examiner

*Primary Examiner*—N. Drew Richards
*Assistant Examiner*—An T. Luu

(57) ABSTRACT

A floating gate drive circuit is revealed that provides boot strap gate drive energy for floating switches with reference terminals that swing between two non-zero dc voltages.

7 Claims, 7 Drawing Sheets

FLOATING GATE DRIVE CIRCUITS

BACKGROUND OF THE INVENTION

1. Field of the Invention

The subject invention generally pertains to electronic power conversion circuits, and more specifically to gate drive circuits for high frequency, switched mode electronic power converters. This application is a continuation-in-part of pending application Ser. No. 10/878,448 filed 2004 Jun. 28. Some of the subject matter of this application was first revealed in Disclosure Document Number 527396.

2. Description of Related Art

One simple gate drive circuit that has seen use in some high volume commercial applications is shown in FIG. 1. This circuit was invented by the applicant, but no patent protection was sought by the assignee. Here an inverted PWM control signal is capacitively coupled to a high side main switch in a buck converter. The gate circuit of the high side switch contains an inverting driver that inverts the gate drive signal a second time resulting in a non-inverted gate drive signal, as desired. The key to the understanding of this simple circuit is the source voltage of the main high side switch. During a turn on transition of the main switch the voltage at the input to the driver $U_2$ is falling, causing the voltage at the output of $U_2$ and the gate of the main switch to rise. As the gate voltage of the main switch rises at the output of $U_2$ the main switch turns on causing the source of the main switch to rise in voltage towards $V_{LINE}$. As the source voltage rises the capacitor $C_{DRIVE}$ is charged through the diode $D_2$, forcing the input of $U_2$ to stay low and the output of $U_2$ to stay high through the transition, as desired. One can see that the double inversion is absolutely necessary for the successful operation of this gate drive circuit. During a turn off transition of the main switch the input of $U_2$ is initially driven high by $C_{DRIVE}$ and is forced to stay high during the transition as the source voltage falls and the diode $D_1$ discharges the capacitor $C_{DRIVE}$. In each case the movement of the source reinforces the initiating transition at the input of $U_2$, which can only occur if $U_2$ is an inverter, as indicated. The high side gate drive circuit is powered by the bootstrap diode $D_{BOOT}$ and the capacitor $C_{BOOT}$, which is charged during the off time of the main switch when the synchronous rectifier conducts. This circuit, as shown, requires that the source of the main switch be at zero volts in order to accomplish charging of the capacitor $C_{BOOT}$ to the proper voltage. What is needed is a more general circuit that can work in applications in which the source voltage of the high side switch is different than zero volts during the off time of the high side switch.

OBJECTS AND ADVANTAGES

An object of the subject invention is to reveal a simple gate drive circuit with a bootstrap mechanism that will work for floating switches that swing between two dc voltages neither of which are ground.

Further objects and advantages of my invention will become apparent from a consideration of the drawings and ensuing description.

These and other objects of the invention are provided by novel circuit techniques that provide boot strap energy to floating switches with reference terminals that swing between non-zero dc voltages.

SUMMARY

The subject invention reveals a method to provide gate drive power via a bootstrap technique applicable to floating switches that swing between two dc voltages, neither of which are at ground potential.

DESCRIPTION OF THE PREFERRED EMBODIMENTS

Figure 1:
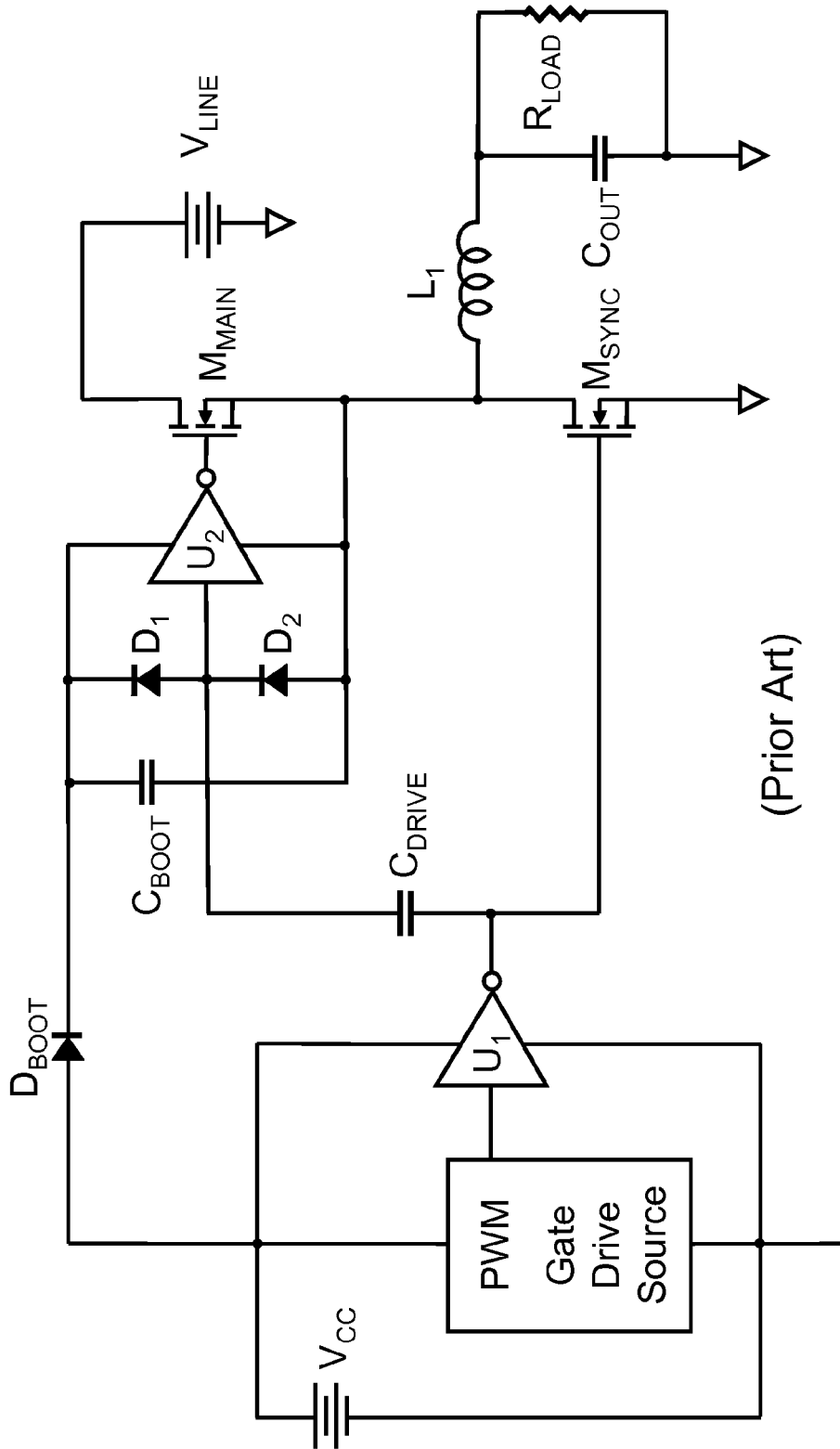
FIG. 1 illustrates a boot strapped high side gate drive circuit according to the prior art.
Figure 2:
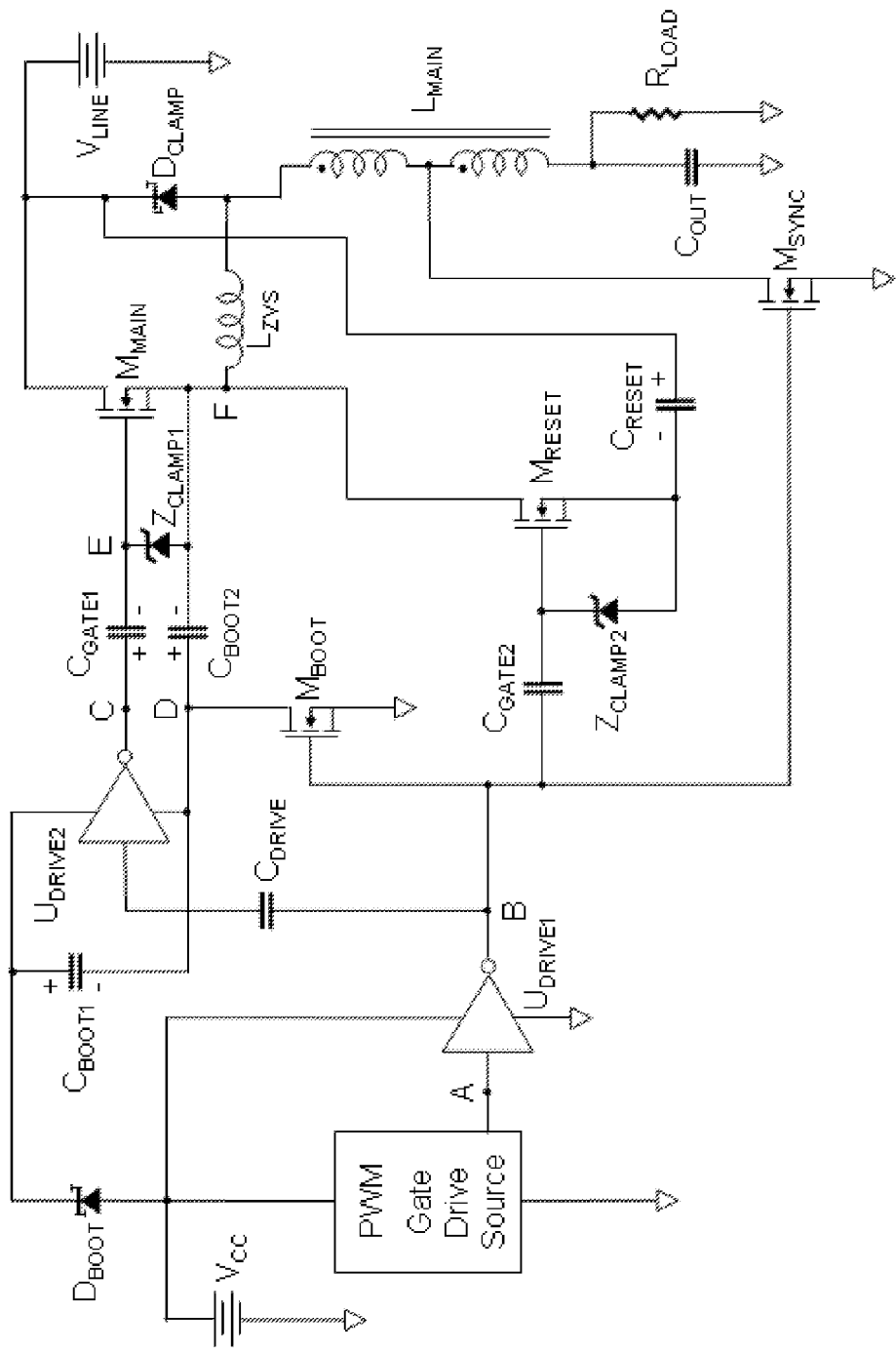
FIG. 2 illustrates a boot strapped floating gate drive circuit according to the subject invention that has the capability to swing the driven floating switch both above and below ground potential.
Figure 3:
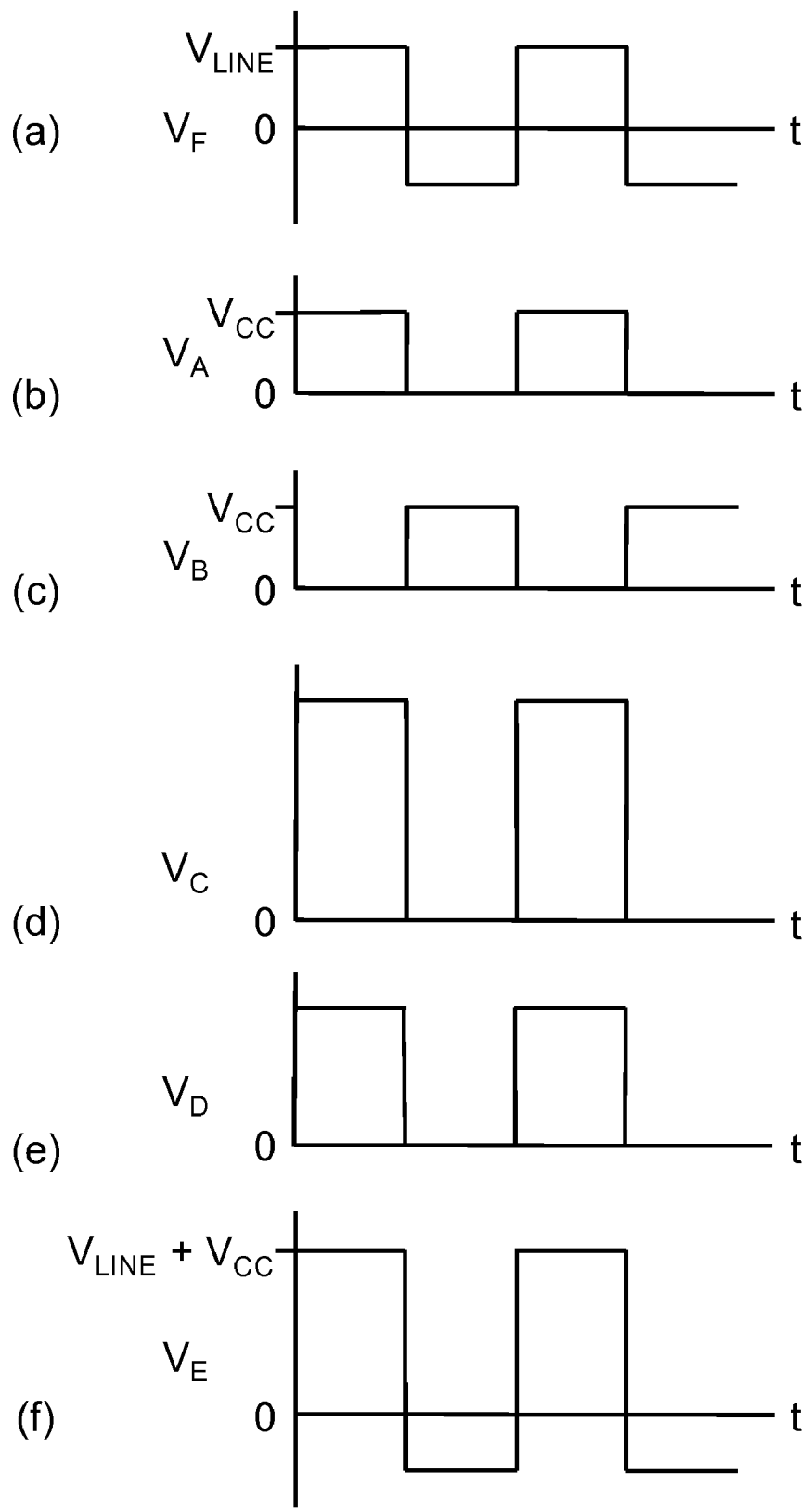
FIG. 3(a) illustrates the source voltage wave form of the floating main switch of the FIG. 2 circuit according to the subject invention.
FIG. 3(b) illustrates the gate drive source voltage wave form of the FIG. 2 circuit according to the subject invention.
FIG. 3(c) illustrates the voltage wave form at the output of the inverting driver $U_{DRIVE1}$ of the FIG. 2 circuit according to the subject invention.
FIG. 3(d) illustrates the voltage wave form at the output of the inverting driver $U_{DRIVE2}$ of the FIG. 2 circuit according to the subject invention.
FIG. 3(e) illustrates the voltage wave form at the drain terminal of the mosfet $M_{BOOT}$ of the FIG. 2 circuit according to the subject invention.
FIG. 3(f) illustrates the gate voltage wave form of the floating main switch of the FIG. 2 circuit according to the subject invention.

FIG. 2 illustrates a ZVS tapped inductor buck converter with a floating main power switch, $M_{MAIN}$. One difficulty with the floating switch and the commercially available level shifting circuit drivers is that they only work if the minimum voltage of the source of the floating switch is zero volts or ground. In the ZVS tapped inductor buck converter illustrated in FIG. 2 the minimum source voltage of the floating main power switch will be negative and the negative source voltage will be line and load dependent. A wave form of the source voltage of $M_{MAIN}$ connected to a node F is illustrated in FIG. 3(a). At the same time the gate to source voltage needed to drive the floating main switch is the same, in general, as the gate to source voltage needed to drive a ground referenced synchronous rectifier, $M_{SYNC}$, and a reset switch, $M_{RESET}$. In the FIG. 2 circuit a first bootstrap capacitor, $C_{BOOT1}$, is charged through a rectifier $D_{BOOT}$ and a switch $M_{BOOT}$ when the main switch, $M_{MAIN}$, is off and the source of $M_{MAIN}$ is at a negative voltage. The desired applied voltage for $C_{BOOT1}$ is $V_{CC}$, which is the voltage of a ground referenced source of dc gate drive voltage and energy, which is typically in the range of 10 to 15 volts for mosfets with standard gate threshold in the 2 to 4 volts range. While $M_{MAIN}$ is off $M_{BOOT}$, $M_{RESET}$, and $M_{SYNC}$ are on and the negative terminal of $C_{BOOT1}$ is at ground potential. $C_{BOOT1}$ charges from $V_{CC}$ through $D_{BOOT}$ and $M_{BOOT}$ to ground so the voltage applied to $C_{BOOT1}$ is $V_{CC}$ minus the forward voltage of $D_{BOOT}$. Also while $M_{MAIN}$ is off a capacitor $C_{BOOT2}$ is charged through $M_{BOOT}$, $M_{RESET}$, $C_{RESET}$, and $V_{LINE}$. The voltage applied to the capacitor $C_{GATE1}$ is approximately equal to the voltage applied to $C_{BOOT2}$ because when $M_{MAIN}$ is off the voltage at the gate of $M_{MAIN}$ is approximately equal to the voltage at the source of $M_{MAIN}$ and the voltage at a node C at the output of $U_{DRIVE2}$ is the same as the voltage at a node D connected at a terminal of $C_{BOOT2}$. When $M_{MAIN}$ is on both terminals of $C_{GATE1}$ are approximately $V_{CC}$ volts more positive than the corresponding terminals of $C_{BOOT2}$. At the beginning of a turn on transition for $M_{MAIN}$ the voltage at node A rises to $V_{CC}$, the voltage at node B drops to ground, thereby turning off $M_{BOOT}$, $M_{RESET}$, and $M_{SYNC}$, the voltage at node C rises to a level in the range of 10 to 15 volts above node D, and the voltage at a node E at a control terminal of the power switch $M_{MAIN}$ rises to a level in the range of 10 to 15 volts above the voltage level at node F connected to the source terminal of $M_{MAIN}$, enhancing the gate of $M_{MAIN}$ which turns $M_{MAIN}$ on. The voltage range of the control terminal of $M_{MAIN}$ is restricted by a voltage clamp in the form of a zener diode $Z_{CLAMP1}$. The voltage rating of $Z_{CLAMP1}$ is equal to $V_{CC}$ so that the operating range of the gate to source voltage of $M_{MAIN}$ is zero volts to $V_{CC}$. The gate to source voltage operating range for the other three power mosfets is the same as for $M_{MAIN}$. Wave forms illustrating the voltages of nodes A, B, C, D, and E are illustrated in FIG. 3(b), FIG. 3(c), FIG. 3(d), FIG. 3(e), and FIG. 3(f), respectively.

Figure 4:
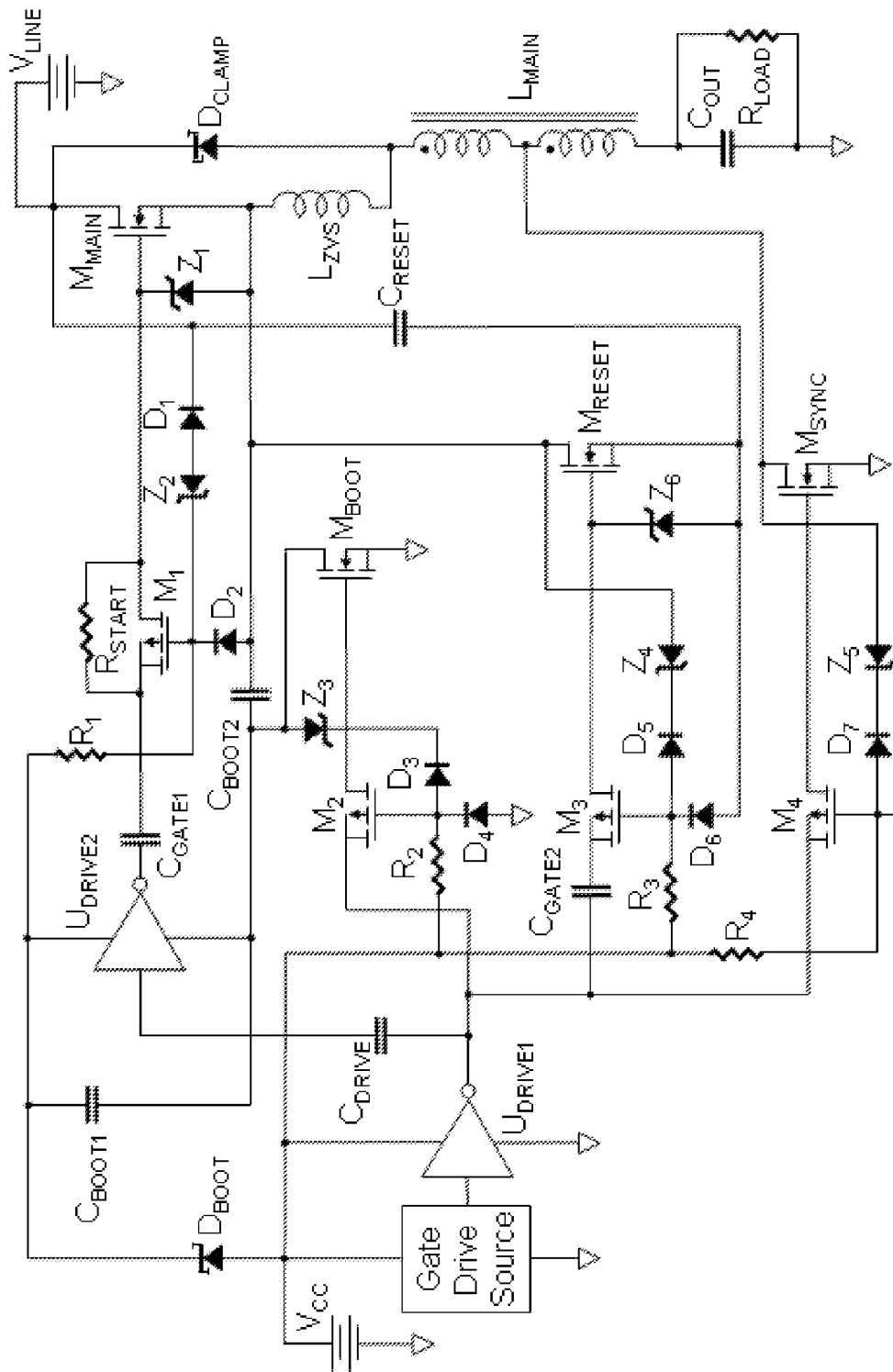
FIG. 4 illustrates a ZVS tapped inductor buck converter employing the floating gate drive circuit of FIG. 2 and an adaptive timing circuit according to the subject invention.

FIG. 4 illustrates a tapped inductor buck converter similar to that shown in FIG. 2, but with an adaptive gate drive circuit added to optimize the gate timing in order to achieve zero voltage switching over a wide range of load and ZVS drive energy conditions.

Figure 5:
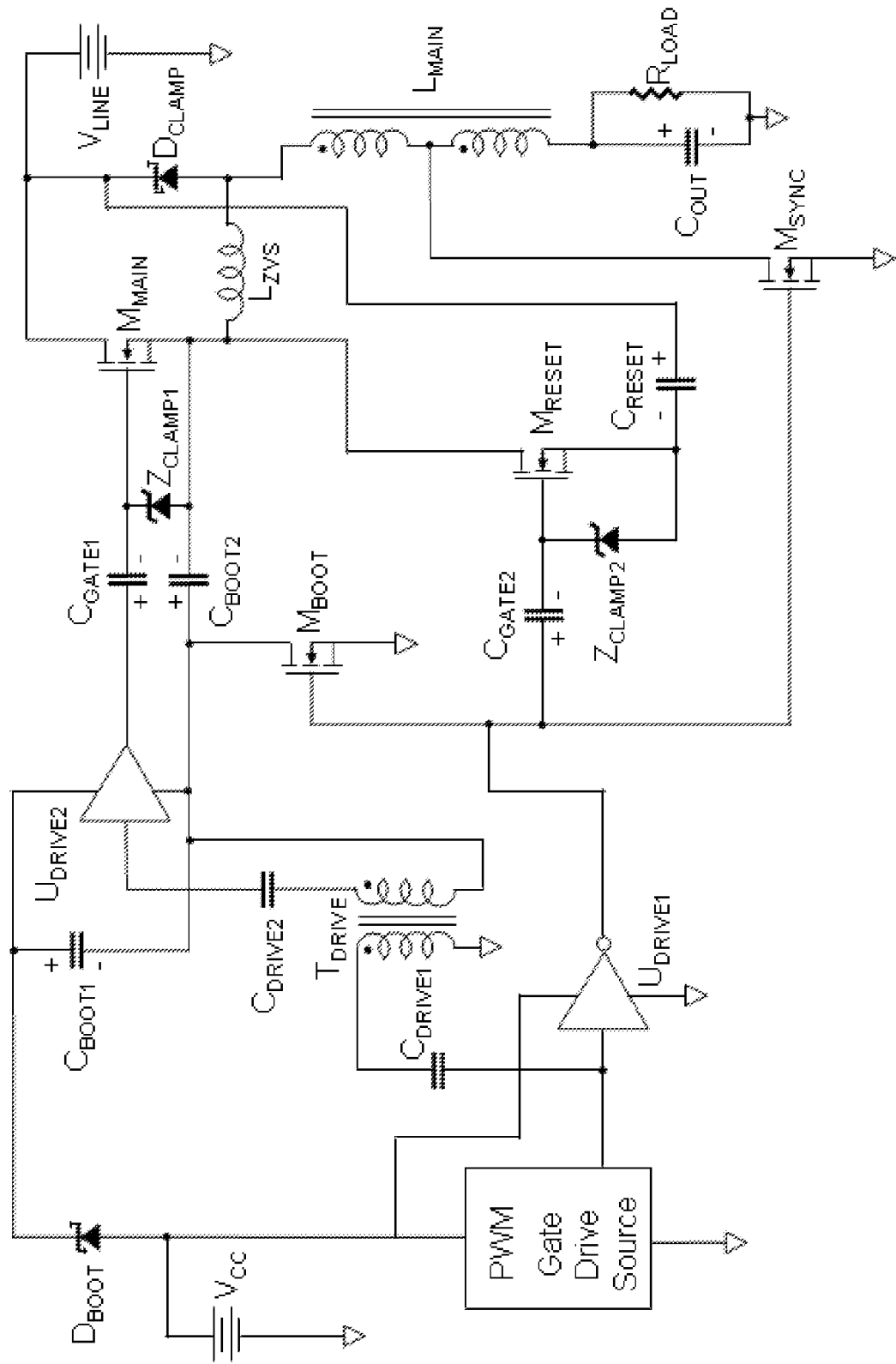
FIG. 5 Illustrates a boot strapped floating gate drive circuit with transformer coupling according to the subject invention that has the capability to swing the driven floating switch both above and below ground potential.

FIG. 5 illustrates a tapped inductor buck converter similar to that shown in FIG. 2 except that the timing information for the floating drive circuit is coupled via a transformer to achieve improved common mode noise rejection. The enhanced common mode noise rejection provided by the transformer enables the state of the floating switch to be set independent of the voltage or voltage slew rate of the source voltage of the floating switch.

Figure 6:
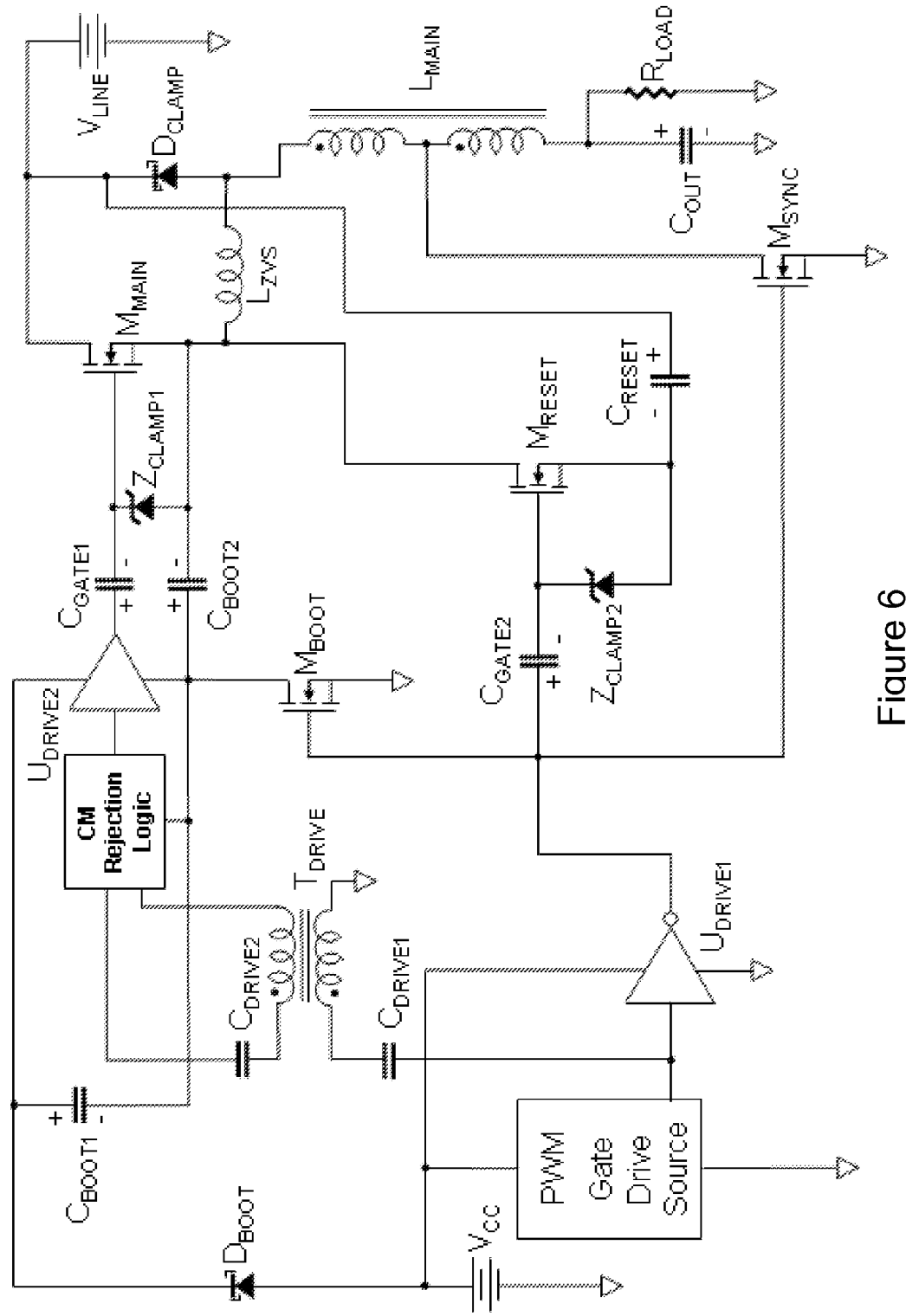
FIG. 6 illustrates a boot strapped floating gate drive circuit with pulse transformer coupling according to the subject invention that has the capability to swing the driven floating switch both above and below ground potential.
Figure 7:
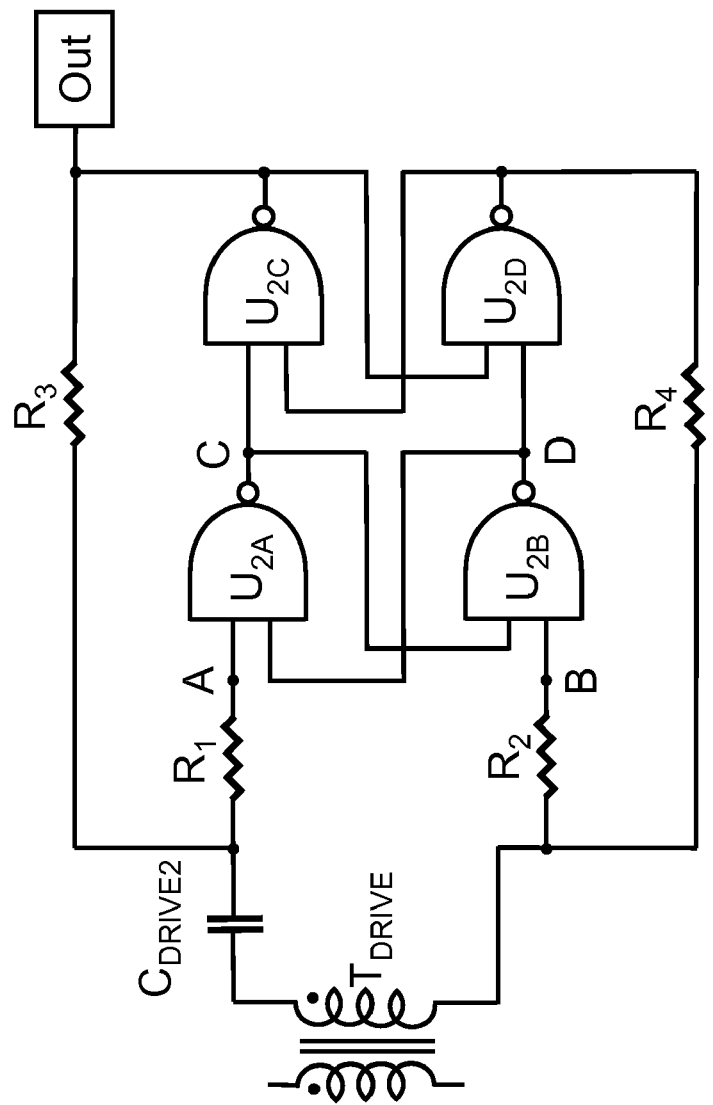
FIG. 7 illustrates a common mode noise rejection logic circuit that can be used in the floating gate drive circuit of FIG. 6 according to the subject invention.

FIG. 6 illustrates a tapped inductor buck converter similar to those illustrated in FIGS. 2 and 5 except that the transformer is replaced with a pulse transformer that sets the state of a digital logic circuit that is used for common mode noise rejection. An example of a suitable common mode noise rejection digital logic circuit is illustrated in FIG. 7. The logic circuit can be set by a brief pulse coupled through the pulse transformer and can be accomplished with a small number of turns and a very small magnetic core or with a coreless transformer.

CONCLUSION, RAMIFICATIONS, AND SCOPE OF INVENTION

Thus the reader will see that gate drive circuits for floating switches whose source or reference terminals swing between two non-zero dc voltages can be powered from simple boot strap circuits comprising a rectifier, a ground referenced switch, a few capacitors, and a simple clamp circuit.

While my above description contains many specificities, these should not be construed as limitations on the scope of the invention, but rather, as exemplifications or preferred embodiments thereof. Many other variations are possible. For example, complementary gate drive circuits for P channel power switches are possible. Circuits of the type shown but with enhancement mode mosfets substituted for bipolar transistors, are possible. Also, the preferred embodiments illustrate examples in which the reference terminal or source of the floating power switch swings between a positive voltage and a negative voltage, but the circuit illustrated will work equally well for floating switches whose reference voltages swing between any two dc voltages, regardless of the signs (polarities with respect to ground) of the dc voltages, and with the polarities of switches, rectifiers, and voltages reversed from those illustrated in the examples. Also, the examples illustrate the application of the novel floating gate drive technique to a main switch, but the technique can also be applied to a synchronous rectifier, a reset switch, or auxiliary switch. Accordingly, the scope of the invention should be determined not by the embodiments illustrated, but by the appended claims and their legal equivalents.

I claim:

1. A floating gate drive circuit for a power switch having a source or reference terminal that swings between two non-zero dc voltages comprising,
    a gate buffer capable of providing sufficient voltage to fully enhance said power switch and sufficient current capability to fully charge and discharge a control terminal of said power,
    a source of gate timing information coupleable to said gate buffer,
    a source of dc gate drive voltage and energy,
    a rectifier having a first terminal connected to a first terminal of said source of dc gate drive voltage and energy,
    a first capacitor having a first terminal connected to a second terminal of said rectifier,
    a second capacitor having a first terminal coupleable to an output of said gate buffer and having a second terminal coupleable to said control terminal of said power switch,
    switch means having a control terminal coupleable to said source of gate timing information, a first main terminal connected a second terminal of said source of dc gate drive voltage and energy, and a second main terminal connected to a second terminal of said first capacitor,
    a third capacitor having a first terminal connected to said second main terminal of said switch means and having a second terminal connected to a reference terminal of said power switch,
    voltage clamping means having a first terminal connected to said control terminal of said power switch and having a second terminal connected to said reference terminal of said power switch,
    whereby said switch means and said rectifier enable charging of said first capacitor to a peak-to-peak voltage substantially equal to a voltage of said source of dc gate drive voltage and energy suitable for driving said power switch, and said switch means together with said voltage clamping means applies a voltage to said second and third capacitors whereby a suitable mechanism for controlling said power switch is achieved.

2. The floating gate drive circuit of claim 1 wherein said source of gate timing information is capacitively coupled to said gate buffer.

3. The floating gate drive circuit of claim 1 wherein said source of gate timing information is magnetically coupled to said gate buffer.

4. The floating gate drive circuit of claim 1 wherein said switch means comprise semiconductor switch means.

5. The floating gate drive circuit of claim 4 wherein said semiconductor switch means comprise a N channel mosfet.

6. The floating gate drive circuit of claim 1 wherein said voltage clamping means comprise semiconductor voltage clamping means.

7. The floating gate drive circuit of claim 6 wherein said semiconductor voltage clamping means comprise a zener diode.

* * * * *